United States Patent
Du et al.

(10) Patent No.: US 10,162,799 B2
(45) Date of Patent: Dec. 25, 2018

(54) BUFFER DEVICE AND CONVOLUTION OPERATION DEVICE AND METHOD

(71) Applicant: Kneron, Inc., San Diego, CA (US)

(72) Inventors: Yuan Du, Los Angeles, CA (US); Li Du, La Jolla, CA (US); Yi-Lei Li, San Diego, CA (US); Yen-Cheng Kuan, San Diego, CA (US); Chun-Chen Liu, San Diego, CA (US)

(73) Assignee: KNERON, INC., San Diego, CA (US)

( * ) Notice: Subject to any disclaimer, the term of this patent is extended or adjusted under 35 U.S.C. 154(b) by 106 days.

(21) Appl. No.: 15/459,675

(22) Filed: Mar. 15, 2017

(65) Prior Publication Data

US 2018/0136872 A1 May 17, 2018

(30) Foreign Application Priority Data

Nov. 14, 2016 (CN) .......................... 2016 1 1002220

(51) Int. Cl.
*G06F 17/15* (2006.01)
*G06F 12/02* (2006.01)

(52) U.S. Cl.
CPC .......... *G06F 17/153* (2013.01); *G06F 12/02* (2013.01)

(58) Field of Classification Search
None
See application file for complete search history.

(56) References Cited

U.S. PATENT DOCUMENTS

| 4,918,742 A * | 4/1990 | Simonds ................. G06F 17/15 382/304 |
| 5,151,953 A | 9/1992 | Landeta |
| 2006/0215929 A1 | 9/2006 | Fresneau |
| 2016/0062947 A1* | 3/2016 | Chetlur ................. G06F 17/153 708/420 |
| 2018/0136872 A1* | 5/2018 | Du ........................ G06F 3/0647 |
| 2018/0173676 A1* | 6/2018 | Tsai ........................ G06F 17/15 |
| 2018/0197084 A1* | 7/2018 | Kim ...................... G06N 3/084 |

FOREIGN PATENT DOCUMENTS

| TW | 504657 B | 10/2002 |
| TW | 201516953 A | 5/2015 |

* cited by examiner

*Primary Examiner* — David H Malzahn
(74) *Attorney, Agent, or Firm* — Muncy, Geissler, Olds & Lowe, P.C.

(57) ABSTRACT

A buffer device includes input lines, an input buffer unit and a remapping unit. The input lines are coupled to a memory and configured to be inputted with data from the memory in a current clock. The input buffer unit is coupled to the input lines and configured to buffer one part of the inputted data and output the part of the inputted data in a later clock. The remapping unit is coupled to the input lines and the input buffer unit, and configured to generate remap data for a convolution operation according to the data on the input lines and the output of the input buffer unit in the current clock. A convolution operation method for a data stream is also disclosed.

17 Claims, 5 Drawing Sheets

BUFFER DEVICE AND CONVOLUTION OPERATION DEVICE AND METHOD

CROSS REFERENCE TO RELATED APPLICATIONS

This Non-provisional application claims priority under 35 U.S.C. § 119(a) on Patent Application No(s). 201611002220.3 filed in People's Republic of China on Nov. 14, 2016, the entire contents of which are hereby incorporated by reference.

BACKGROUND OF THE INVENTION

Field of Invention

The present invention relates to a buffer device and an operation device. In particular, the present invention relates to a buffer device applied to a convolution operation and a convolution operation device.

Related Art

Convolution is a mathematical operator that generates a third function by two functions. The convolution is widely used in science, engineering, and mathematics, such as image processing, electronic engineering, signal processing, and the likes.

The Convolutional Neural Network (CNN) is also an application of convolution operations that includes one or more convolutional layers and associated weight and pooling layers. The convolutional neural network is a feedforward neural network, and its artificial neurons can respond to a part of the peripheral units within the covered range. In general, the convolutional neural network has a good performance in the large image processing.

Convolutional neural network is also used in deep learning. The convolutional neural network has better results in image and speech recognition than other deep learning architectures. In addition, the model using the convolutional neural network can also be trained by using back propagation algorithm. Compared with other deep learning architectures and feedforward neural networks, the estimated parameters of convolutional neural network are less, so it is an important trend of current deep learning architecture.

However, convolution operation usually consumes a lot of performance. In the convolutional neural network application, the convolution operation can occupy most performance of the processor. Therefore, it is desired to provide a buffer device and a convolution operation device that can improve the performance of the convolution operation. In addition, the Internet multimedia application, such as streaming media, has become more and more popular. Therefore, it is also desired to provide a buffer device and a convolution operation device capable of processing data streams.

SUMMARY OF THE INVENTION

In view of the foregoing, an objective of the present invention is to provide a buffer device and a convolution operation device capable of processing data streams.

In view of the foregoing, an objective of the present invention is to provide a buffer device and a convolution operation device that can improve the performance of the convolution operation.

To achieve the above objectives, the present invention discloses a buffer device, which is coupled to a memory and includes input lines, an input buffer unit and a remapping unit. The input lines are coupled to the memory and configured to be inputted with data from the memory in a current clock. The input buffer unit is coupled to the input lines and configured to buffer a part of the inputted data and output the part of the inputted data in a later clock. The remapping unit is coupled to the input lines and the input buffer unit, and configured to generate remap data for a convolution operation according to the data on the input lines and an output of the input buffer unit in the current clock.

In one embodiment, W data are inputted from the memory to the input lines in the current clock, and the remapping unit generates W sets of the remap data for W convolution operations.

In one embodiment, the input buffer unit buffers the latest K data from the W data and outputs the latest K data in the later clock, and the output of the input buffer unit is arranged prior to the input lines in order.

In one embodiment, each set of the remap data includes M remap data, and the convolution operation is an M×M convolution operation.

In one embodiment, the remapping unit retrieves M data from the output of the input buffer unit and the input lines as a set of the remap data, and the data of the output of the input buffer unit and the input lines in sequence are retrieved by M times every J strides.

In one embodiment, each stride between the convolution operations is 1, and each set of the remap data includes 3 remap data. The convolution operation is a 3×3 convolution operation, and the input buffer unit is configured to buffer the latest 2 inputted data and output the latest 2 inputted data in the later clock.

In one embodiment, the buffer device further includes a control unit coupled to and controlling the remapping unit.

In one embodiment, the data stored in the memory are in a 2D array, the buffer device is configured as a column buffer, and the input buffer unit is configured as a partial row buffer.

In one embodiment, the remapping unit has a first convolution mode and a second convolution mode. When operating in the first convolution mode, the remapping unit generates the remap data for the convolution operation according to the data on the input lines and the output of the input buffer unit in the current clock. When operating in the second convolution mode, the remapping unit outputs the data on the input lines for the convolution operation in the current clock.

In one embodiment, the first convolution mode is a 3×3 convolution operation mode, and the second convolution mode is a 1×1 convolution operation mode.

To achieve the above objectives, the present invention also discloses a convolution operation device, which includes a memory, a convolution operation module, and a buffer device. The buffer device includes input lines, an input buffer unit and a remapping unit. The input lines are coupled to the memory and configured to be inputted with data from the memory in a current clock. The input buffer unit is coupled to the input lines and configured to buffer a part of the inputted data and output the part of the inputted data in a later clock. The remapping unit is coupled to the input lines and the input buffer unit, and configured to generate remap data for a convolution operation according to the data on the input lines and an output of the input buffer unit in the current clock. The remap data are inputted to the convolution operation module.

In one embodiment, W data, which are still not inputted in the previous convolution operation, are retrieved from the data stream in the memory, and W sets of the remap data are generated as inputs of W convolution operations.

In one embodiment, the latest K data of the W data, which are still not inputted in the previous convolution operation, are kept in the buffer for the next convolution operation.

In one embodiment, each set of the remap data includes M remap data, and the convolution operation is an M×M convolution operation.

In one embodiment, the remapping unit retrieves M data from the output of the input buffer unit and the input lines as a set of the remap data, and the data of the output of the input buffer unit and the input lines in sequence are retrieved by M times every J strides.

In one embodiment, each stride between the convolution operations is 1, and each set of the remap data includes 3 remap data. The convolution operation is a 3×3 convolution operation, and the latest 2 of the data, which are still not inputted in the previous convolution operation, are kept in the buffer for the next convolution operation.

In one embodiment, the buffer device further includes a control unit coupled to and controlling the remapping unit.

In one embodiment, the data stored in the memory are in a 2D array, the buffer device is configured as a column buffer, and the input buffer unit is configured as a partial row buffer.

In one embodiment, the amount of the inputted data is equal to the amount of the convolution operations executed by the convolution operation module in one clock.

In one embodiment, the convolution operation module and the buffer device can be operated in a first convolution mode or a second convolution mode of claim 1. When operating in the first convolution mode, the remapping unit generates a plurality of remapping data, which are outputted to the convolution operation module, according to the data on the input lines and the output of the input buffer unit in the current clock. When operating in the second convolution mode, the remapping unit outputs the data on the input lines to the convolution operation module in the current clock.

In one embodiment, the first convolution mode is a 3×3 convolution operation mode, and the second convolution mode is a 1×1 convolution operation mode.

To achieve the above objectives, the present invention also discloses a convolution operation method for a data stream, which includes the following steps of: retrieving inputted data in a previous convolution operation from a buffer; retrieving residual data from the data stream, which are still not inputted in the previous convolution operation; generating a plurality sets of remap data according to the data retrieved from the buffer and the data stream; executing a current convolution operation based on a filter and the sets of the remap data; and keeping a part of data executed in the current convolution operation in the buffer, which is provided for a next convolution operation.

In one embodiment, W data, which are still not inputted in the previous convolution operation, are retrieved from the data stream in the memory, and W sets of the remap data are generated as inputs of W convolution operations.

In one embodiment, the latest K data of the W data, which are still not inputted in the previous convolution operation, are kept in the buffer for the next convolution operation.

In one embodiment, each set of the remap data includes M remap data, and the convolution operation is an M×M convolution operation.

In one embodiment, each stride between the convolution operations is 1, and each set of the remap data includes 3 remap data. The convolution operation is a 3×3 convolution operation, and the latest 2 of the data, which are still not inputted in the previous convolution operation, are kept in the buffer for the next convolution operation.

In one embodiment, the buffer is a register configured inside a processor, and the memory is cache memory configured inside the processor.

As mentioned above, the input buffer unit of the buffer device can buffer a part of the inputted data and output the buffered data as the inputted data in the next clock. Accordingly, even if the required amount of inputted data for the convolution operation is larger than the amount of one reading action from the memory, the remapping unit can retrieve the lacked data from the input buffer unit so as to provide sufficient remap data for the convolution operation. This configuration can improve the entire performance of the convolution operation. In addition, since the amount of the data outputted from the memory is equal to the amount of the output of the convolution operation, this architecture is also suitable for processing the data streams.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
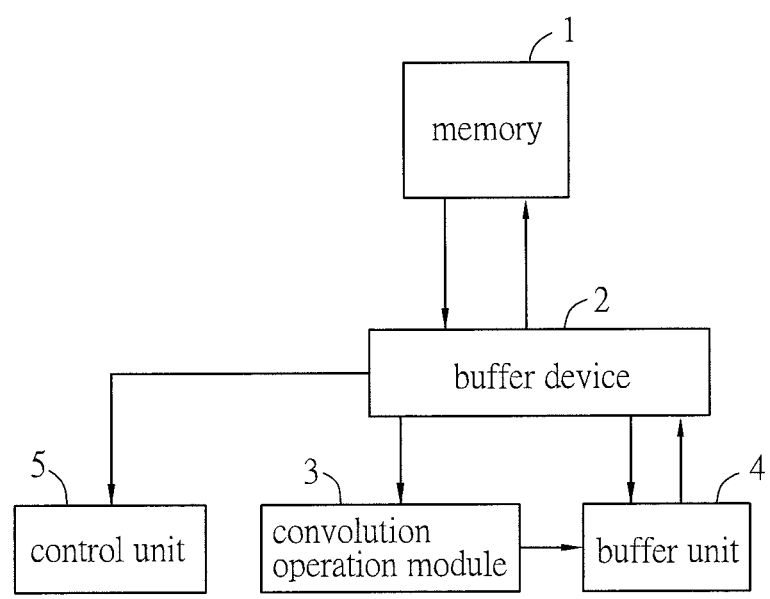
FIG. 1 is a block diagram showing a convolution operation device according to an embodiment of the invention.

FIG. 1 is a block diagram showing a convolution operation device according to an embodiment of the invention. As shown in FIG. 1, the convolution operation device includes a memory 1, a convolution operation module 3, a buffer device 2, a control unit 5 and a buffer unit 4. The convolution operation device can be applied in the convolutional neural network (CNN).

The memory 1 stores the data for the convolution operation. The data include, for example, image data, video data, audio data, statistics data, or the data of any layer of the convolutional neural network. The image data may contain the pixel data. The video data may contain the pixel data or movement vectors of the frames of the video, or the audio data of the video. The data of any layer of the convolutional neural network are usually 2D array data, and these data are usually the image data.

All or most data can be stored in an additional device, such as another memory, and all or a part of these data are loaded into the memory 1 when executing the convolution operation. Then, the buffer device 2 inputs the data into the convolution operation module 3 for executing the convolution operation. If the inputted data are from the data stream, the latest data of the data stream are written into the memory 1 for the convolution operation.

Regarding to the image data or the frame data of video, the data are processed column by column and the data of multiple rows of each column are read at the same time. Accordingly, within a clock, the data of one column and multiple rows in the memory 1 are inputted to the buffer device 2. In other words, the buffer device 2 is functioned as a column buffer.

The buffer device 2 is coupled to the memory 1 and the convolution operation module 3. A memory access width between the buffer device 2 and the memory 1 is limited, and the convolution operation executed by the convolution operation module 3 is actually related to the memory access width. When reaching the bottleneck of the input from the memory, the performance of the convolution operation can be impacted and decreased.

In practice, the required input of the convolution operation module 3 includes not only the data but also the coefficients. Due to the parallel processing, the convolution operation module 3 can execute more than one convolution operations. That is, the convolution operation module 3 can execute multiple convolution operations for the adjacent data for improving the performance. Since the stride is smaller than the sliding window or the convolution size, the adjacent convolution operations usually processes some overlapped data. In the general convolutional neural network application, the common sliding windows include 1×1, 3×3, 5×5, 7×7 and the likes, and the most popular sliding window is 3×3.

For example, the convolution operation module 3 includes a plurality of convolution units, and each convolution unit executes a convolution operation based on a filter and a plurality of current data. After the convolution operation, a part of the current data is kept for the next convolution operation. The buffer device 2 retrieves a plurality of new data from the memory 1, and the new data are inputted from the buffer device 2 to the convolution unit. The new data are not duplicated with the current data. For example, the new data are not counted in the previous convolution operation, but are used in the current convolution operation. The convolution unit of the convolution operation module 3 can execute a next convolution operation based on the filter, the kept part of the current data, and the new data.

In one aspect, the convolution operation device is, for example, a processor, and the memory 1 is a cache memory within the processor. The convolution operation module 3 may include one or more convolution unit arrays. Each convolution unit array includes a plurality of convolution units, and the convolution units can simultaneously execute multiple convolution operations for processing different sets of inputted data. Each set of inputted data may contain some data duplicated with a part of the previous or next set of inputted data. The buffer device includes a plurality of functional units for improving the performance of the parallel processes of the convolution operations. The control unit 5, the buffer unit 4, the convolution unit array and the buffer device are made of logical circuits, and each of the above units may include a plurality of logical elements for performing the desired function. Besides, the memory 1, the convolution operation module 3, the buffer device 2, the control unit 5 and the buffer unit 4 can be integrated in a single IC.

In another aspect, the memory 1 can be a random access memory (RAM), and the convolution operation module 3, the buffer device 2, the control unit 5 and the buffer unit 4 can be integrated in a single IC.

The control unit 5 may include an instruction decoder and a controller. The instruction decoder receives an instruction from the controller, and then decodes the instruction for obtaining the data size, columns and rows of the inputted data, the number of the sliding window (or convolution size), and the initial address of the inputted data in the memory 1. In addition, the instruction decoder can also obtain the type of the sliding window and the outputted characteristics number from the controller, and output the proper blank signal to the buffer device 2. The buffer device 2 can operate according to these signals as well as controlling the operations of the convolution operation module 3 and the buffer unit 4. For example, the obtained information may include the clock for inputting the data from the memory 1 to the buffer device 2 and the convolution operation module 3, the sizes of the convolution operations of the convolution operation module 3, the reading address of the data in the memory 1 to be outputted to the buffer device 2, the writing address of the data into the memory 1 from the buffer unit 4, and the convolution modes of the convolution operation module 3 and the buffer device 2.

For example, the buffer device 2 and the convolution operation module 3 can operate in a first convolution mode or a second convolution mode. The selected convolution mode is decided by the control unit of the buffer device 2. In other words, the control unit of the buffer device 2 controls the buffer device 2 and the convolution operation module 3 to operate in the first convolution mode or the second convolution mode. The sliding windows (or convolution sizes) for different convolution modes are different. For example, the first convolution mode is a 3×3 convolution operation mode, while the second convolution mode is a 1×1 convolution operation mode.

For example, the control unit 5 can receive a control signal or a mode instruction, and then select one of the convolution modes for the other modules and units according to the received control signal or mode instruction. The control signal or mode instruction can be outputted from another control unit or processing unit.

When the buffer device 2 and the convolution operation module 3 are operated in the first convolution mode, the buffer device 2 can keep a part of the inputted data of the previous clock for the current clock, and generate a plurality of remap data according to the kept part of the inputted data of the previous clock and the inputted data of the current clock. The remap data are inputted to the convolution operation module 3. The remap data include the data for a plurality sets of sliding windows. For example, 3 remap data can be provided for the 3×3 convolution operation mode. Since the convolution operation module 3 has the parallel operation and sliding functions, when the stride is 1, the convolution operation module 3 can perform a 3×3 convolution operation as providing 3 remap data in one clock.

When operating in the second convolution mode, the buffer device 2 can output the inputted data of the current clock to the convolution operation module 3. In this case, it is unnecessary to keep a part of the inputted data of the previous clock for the current clock.

The buffer unit 4 can temporary store the result of the convolution. In some case, it is possible to perform a pooling operation in advance. The operation result can be stored in the memory 1 through the buffer device 2 and then outputted to other units from the memory 1.

Figure 2:
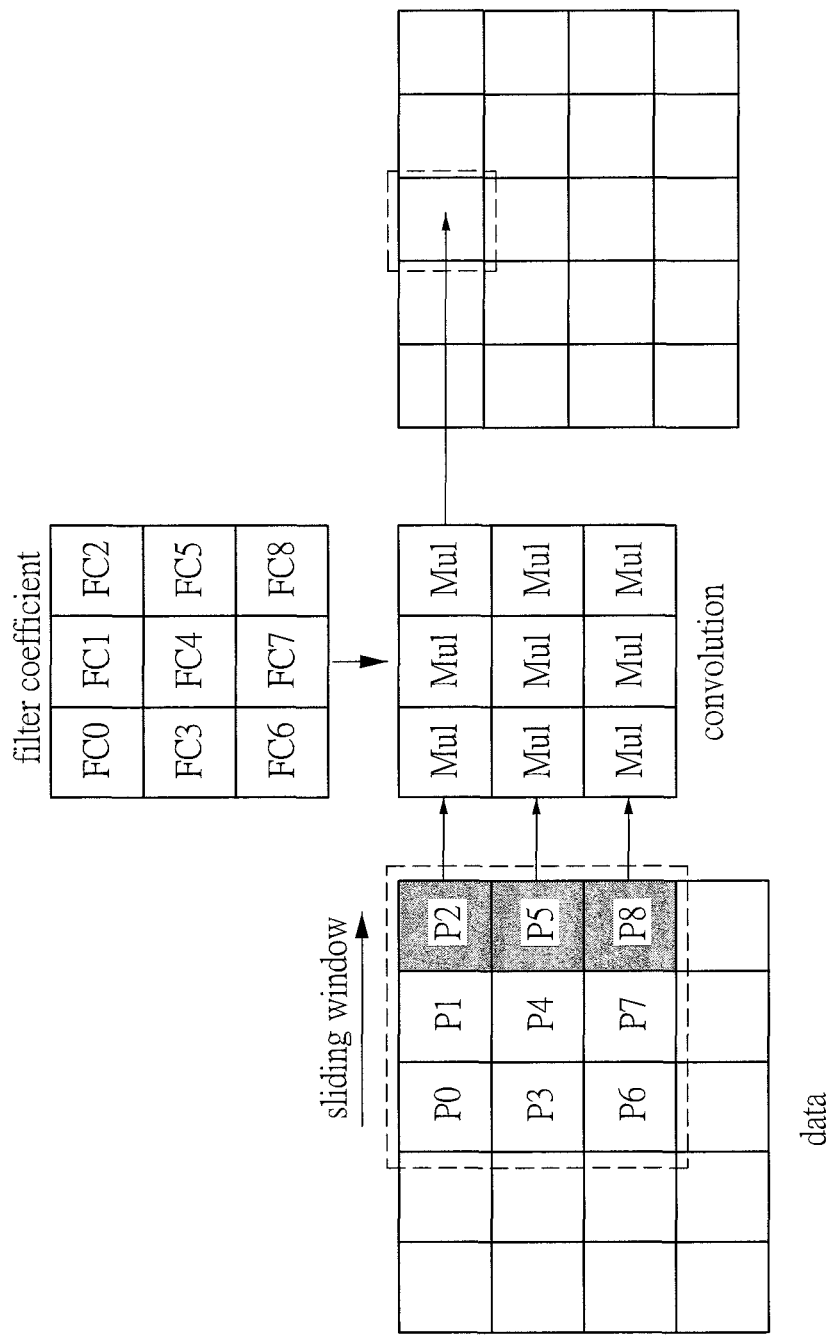
FIG. 2 is a schematic diagram showing that the convolution operation device of FIG. 1 executes a convolution operation with 2D data.

FIG. 2 is a schematic diagram showing that the convolution operation device of FIG. 1 executes a convolution operation with 2D data. The 2D data has multiple columns and multiple rows, and the 2D data can be an image data such as 5×4 pixels. As shown in FIG. 2, a filter of a 3×3 array can be used in the convolution operation. The filter has the coefficients of FC0~FC8, and the stride of the filter is smaller than the shortest width of the filter. The size of the filter matches the sliding window or convolution operation window. The sliding window can move on the 5×4 image. In each movement, a 3×3 convolution operation is executed regarding to the data P0~P8 corresponding to the window. The result of the convolution operation is named as a characteristics value. The moving distance of the sliding window S is a stride. The size of the stride is smaller than the size of the sliding window or the convolution size. In this embodiment, the stride of the sliding window is smaller than the distance of three pixels. In general, the adjacent convolution operations usually have overlapped data. If the stride is 1, the data P2, P5 and P8 are the new data, and the data P0, P1, P3, P4, P6 and P7 have been inputted in the previous convolution operation. In the convolutional neural network, the common size of the sliding window can be 1×1, 3×3, 5×5, 7×7, or the likes. In this embodiment, the size of the sliding window is 3×3.

Figure 3:
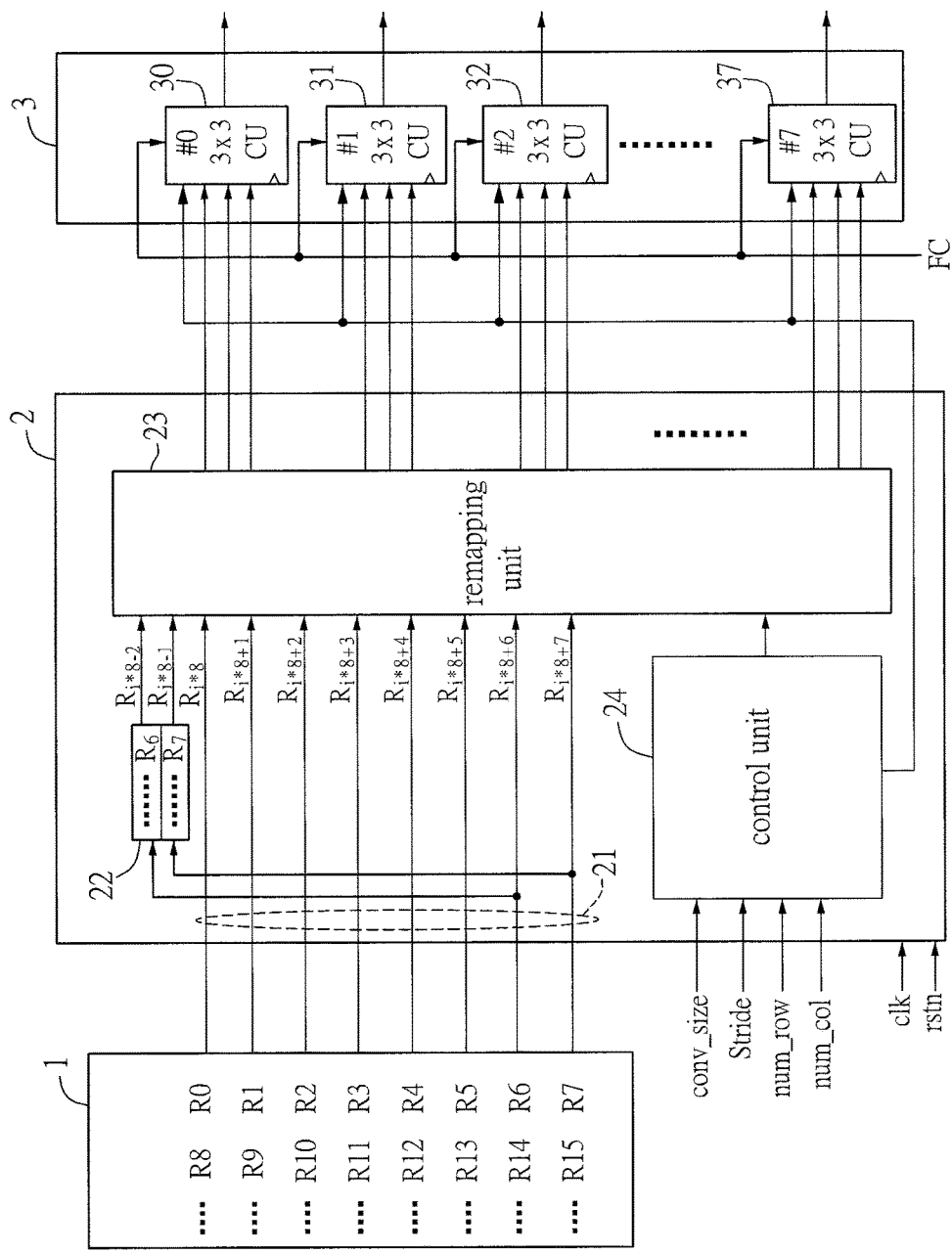
FIG. 3 is a block diagram showing a memory, a buffer device and a convolution operation module according to an embodiment of the invention.

FIG. 3 is a block diagram showing a memory, a buffer device and a convolution operation module according to an embodiment of the invention. Referring to FIG. 3, the buffer device 2 includes input lines 21, an input buffer unit 22 and a remapping unit 23. The input lines are coupled to the memory 1 and configured to be inputted with data from the memory 1 in a current clock. The input buffer unit 22 is coupled to the input lines 21 and configured to buffer a part of the inputted data and output the part of the inputted data in a later clock. The remapping unit 23 is coupled to the input lines 21 and the input buffer unit 22, and configured to generate remap data for a convolution operation according to the data on the input lines 21 and an output of the input buffer unit 22 in the current clock. The remap data are inputted to the convolution operation module 3 for convolution operation.

For example, W data are inputted from the memory 1 to the input lines 21 in the current clock, and the remapping unit 23 generates W sets of remap data, which are inputted to the convolution operation module 3. Then, the convolution operation module 3 executes W convolution operations according to the W sets of remap data. In general, the W sets of remap data can be inputted to the multiple convolution units of the convolution operation module 3, respectively, for executing the convolution operations individually. The input buffer unit 22 buffers the latest K data from the W data and outputs the latest K data in the later clock, and the output of the input buffer unit 22 is arranged prior to the input lines 21 in order. Each set of remap data includes M remap data, and the convolution operation is an M×M convolution operation. The remapping unit 23 retrieves M data from the output of the input buffer unit 22 and the input lines 21 as a set of remap data, and the data of the output of the input buffer unit 22 and the input lines 21 in sequence are retrieved by M times every J strides. In some aspects, the amount of the inputted data and the amount of the convolution operations executed by the convolution operation module 3 in the same clock are the same.

In this embodiment, W is 8, K is 2, M is 3, and J is 1. To be noted, these values are for illustrations only and are not to limit the invention. In other embodiments, W, K, M and J can be set as other values.

In this embodiment, the input lines 21 are inputted with 8 data from the memory 1. Each data is one byte. The input buffer unit 22 is configured to buffer the latest two data in the current clock and output the buffered data in a later clock. For example, in the first clock, data R0~R7 are inputted to the remapping unit 23, and data R6 and R7 are also inputted to the input buffer unit 22. In the second clock, data R8~R15 are inputted to the remapping unit 23, and data R14 and R15 are also inputted to the input buffer unit 22. In the i+1 clock, data R(i*8)~R(i*8+7) are inputted to the remapping unit 23, and data R(i*8+6) and R(i*8+7) are also inputted to the input buffer unit 22.

In one clock, 10 data are inputted to the remapping unit 23. For example, in the first clock, data R0~R7 of the input lines 21 are inputted to the remapping unit 23. In the second clock, data R6~R7 buffered in the input buffer unit 22 and data R8~R15 of the input lines 21 are inputted to the remapping unit 23. In the i+1 clock, data R(i*8−2)~R(i*8−1) buffered in the input buffer unit 22 and data R(i*8)~R(i*8+7) of the input lines 21 are inputted to the remapping unit 23.

The remapping unit 23 generates 8 sets of remap data, which are then outputted to the convolution operation module 3. Each set of remap data includes 3 remap data, and each remap data is 1 byte. Each of the convolution units 30~37 has a 3×3 convolution operation, and the stride between the convolution operations is 1. The generation of the remap data will be described hereinafter with reference to FIG. 4.

Since the convolution operation is a 3×3 convolution operation and the stride between the convolution operations is 1, at least 10 data are required to generate 8 sets of remap data for 8 convolution operations. In the case of lacking the input buffer unit 22, the remapping unit 23 can only get 8 data from the input lines 21. Accordingly, only 6 sets of remap data (for 6 convolution operations) can be generated. Besides, the data retrieved from the memory always contains 2 data that have been loaded in the previous clock. Moreover, the amount of data inputted from the memory 1 is not equal to the amount of the convolution operations executed by the convolution operation module 3 in one clock. This will reduce the performance of the entire device.

In this case configured with the input buffer unit 22, the remapping unit 23 can get 10 data in one clock, so that it is possible to generate 8 sets of remap data for executing 8 convolution operations. Thus, the amount of data inputted from the memory 1 is equal to the amount of the convolution operations executed by the convolution operation module 3 in one clock.

Figure 4:
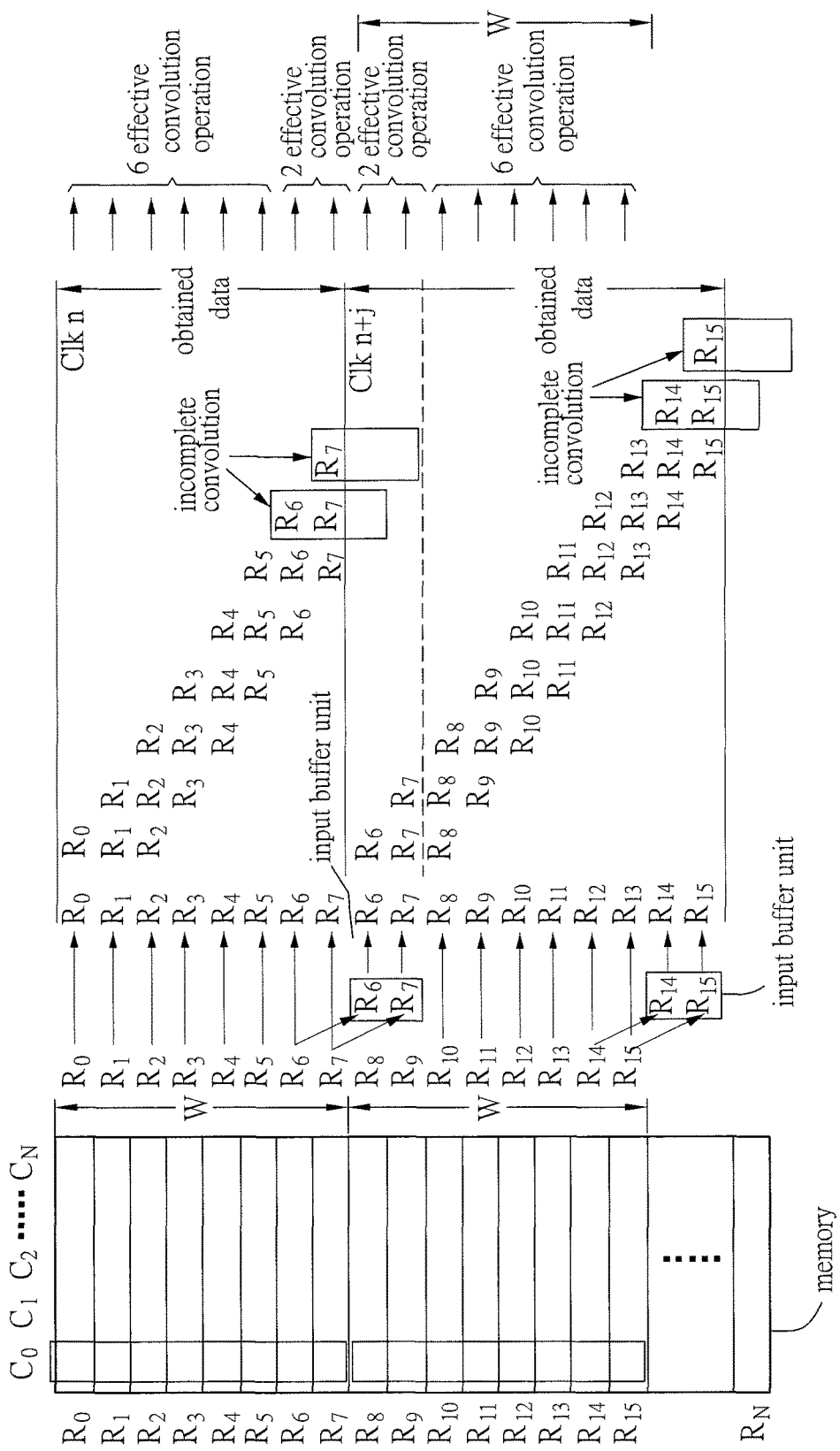
FIG. 4 is a schematic diagram showing the operation of the buffer device of FIG. 2.

FIG. 4 is a schematic diagram showing the operation of the buffer device of FIG. 2. Referring to FIGS. 3 and 4, the data stored in the memory 1 are 2D array data for example. The buffer device 2 is configured as a column buffer, and the input buffer unit 22 is configured as a partial row buffer.

The sliding window is to read 8 rows of data column by column. In each clock, the 8 rows of data of the memory 1 are 8 inputted data.

In the clock Clk n, the data R0~R7 are outputted from the memory 1 to the remapping unit 23 through the input lines 21, and the data R6~R7 are also outputted to the input buffer unit 22. The remapping unit 23 retrieves 3 data from the data of the input lines 21 (data R0~R7) in sequence as a set of remap data. Then, the remapping unit 23 slide for 1 stride, and retrieves additional 3 data from the data of the input lines 21 (data R0~R7) in sequence as a next set of remap data. Accordingly, the retrieved sets of remap data include a set of data R0~R2, a set of data R1~R3, . . . , and a set of data R5~R7. Since the data inputted to the remapping unit 23 are insufficient (only 8 data are inputted), the remapping unit 23 can only retrieve 6 sets of remap data for the convolution operation. In this case, the remapping unit 23 will generate 2 sets of data that can't be used for the effective convolution operations. To be noted, this situation can only happen at the initial stage.

In the clock Clk n+1, the data R6~R7 are outputted from the input buffer unit 22 to the remapping unit 23 and the data R8~R15 are outputted from the memory 1 to the remapping unit 23 through the input lines 21. The data R14~R15 are also outputted to the input buffer unit 22. The remapping unit 23 retrieves 3 data from the output of the input buffer unit 22 (data R6~R7) and the data of the input lines 21 (data R8~R15) in sequence as a set of remap data. Then, the remapping unit 23 slide for 1 stride, and retrieves additional 3 data from the output of the input buffer unit 22 (data R6~R7) and the data of the input lines 21 (data R8~R15) in sequence as a next set of remap data. Accordingly, the retrieved sets of remap data include a set of data R6~R8, a set of data R7~R9, . . . , and a set of data R13~R15. Accordingly, totally 10 data are inputted to the remapping unit 23, and the remapping unit 23 can retrieve 8 sets of remap data for the effective convolution operations.

Similarly, in the clock Clk n+i, the data R(i*8−2)~R(i*8−1) are outputted from the input buffer unit 22 to the remapping unit 23 and the data R(i*8)~R(i*8+7) are outputted from the memory 1 to the remapping unit 23 through the input lines 21. The data R(i*8+6)~R(i*8+7) are also outputted to the input buffer unit 22. The remapping unit 23 retrieves 3 data from the output of the input buffer unit 22 (data R(i*8−2)~R(i*8−1)) and the data of the input lines 21 (data R(i*8)~R(i*8+7)) in sequence as a set of remap data. Then, the remapping unit 23 slide for 1 stride, and retrieves additional 3 data from the output of the input buffer unit 22 (data R(i*8−2)~R(i*8−1)) and the data of the input lines 21 (data R(i*8)~R(i*8+7)) in sequence as a next set of remap data. Accordingly, the retrieved sets of remap data include a set of data R(i*8−2)~R(i*8), a set of data R(i*8−1)~R(i*8+1), . . . , and a set of data R(i*8+5)~R(i*8+7). Accordingly, totally 10 data are inputted to the remapping unit 23, and the remapping unit 23 can retrieve 8 sets of remap data for the effective convolution operations. In one clock, 8 data are read from the memory 1, and correspondingly 8 convolution operations are executed.

With reference to FIG. 3, the buffer device 2 further includes a control unit 24, which is coupled to and controls the remapping unit 23. The control unit 5 can control the operations of the convolution operation module 3, the buffer device 2 and the buffer unit 4. For example, the control unit 5 can control the clock for inputting the data from the memory 1 to the buffer device 2 and the convolution operation module 3, the sizes of the convolution operations of the convolution operation module 3, the reading address of the data in the memory 1 to be outputted to the buffer device 2, the writing address of the data into the memory 1 from the buffer unit 4, and the convolution modes of the convolution operation module 3 and the buffer device 2. The signal conv_size, the signal Stride, the signal num_row, and the signal num_col are inputted to the control unit 24. The signal conv_size indicates the size of the current convolution, the signal Stride indicates the stride between the convolution operations, the signal num_row indicates the row amount of the current data, and the signal num_col indicates the column amount of the current data. The control unit 24 can control the convolution operation mode of the remapping unit 23 and the convolution operation module 3 according to the signal conv_size, and control the sliding size according to the signal Stride.

For example, the remapping unit 23 and the convolution operation module 3 can be operated in the first convolution operation mode or the second convolution operation mode. The control unit 24 can decide to operate in which convolution mode. That is, the control unit 24 control the remapping unit 23 and the convolution operation module 3 to operate in the first convolution mode or the second convolution operation mode. Different convolution modes have different sliding windows or convolution sizes for convolution operations. For instance, the first convolution mode is a 3×3 convolution operation mode, while the second convolution operation mode is a 1×1 convolution operation mode.

When the remapping unit 23 and the convolution operation module 3 are operated in the first convolution mode, the remapping unit 23 generates the remap data according to the data in the input lines 21 and the output of the input buffer unit 22 in the current clock. Then, the generated remap data are sent to the convolution operation module 3 for convolution operation. The input buffer unit 22 can keep a part of the inputted data of the previous clock for the current clock, and the remapping unit 23 generate a plurality of remap data according to the kept part of the inputted data of the previous clock and the inputted data in the input lines 21 of the current clock. The remap data are inputted to the convolution operation module 3. The remap data include the data for a plurality sets of sliding windows. For example, 3 remap data can be provided for the 3×3 convolution operation mode. Since the convolution operation module 3 has the parallel operation and sliding functions, when the stride is 1, the convolution operation module 3 can perform a 3×3 convolution operation as providing 3 remap data in one clock.

When operating in the second convolution mode, the remapping unit 23 outputs the input data in the input lines 21 of the current clock to the convolution operation module 3. In this case, the remapping unit 23 doesn't need the kept part of the inputted data of the previous clock from the input buffer unit 22.

Figure 5:
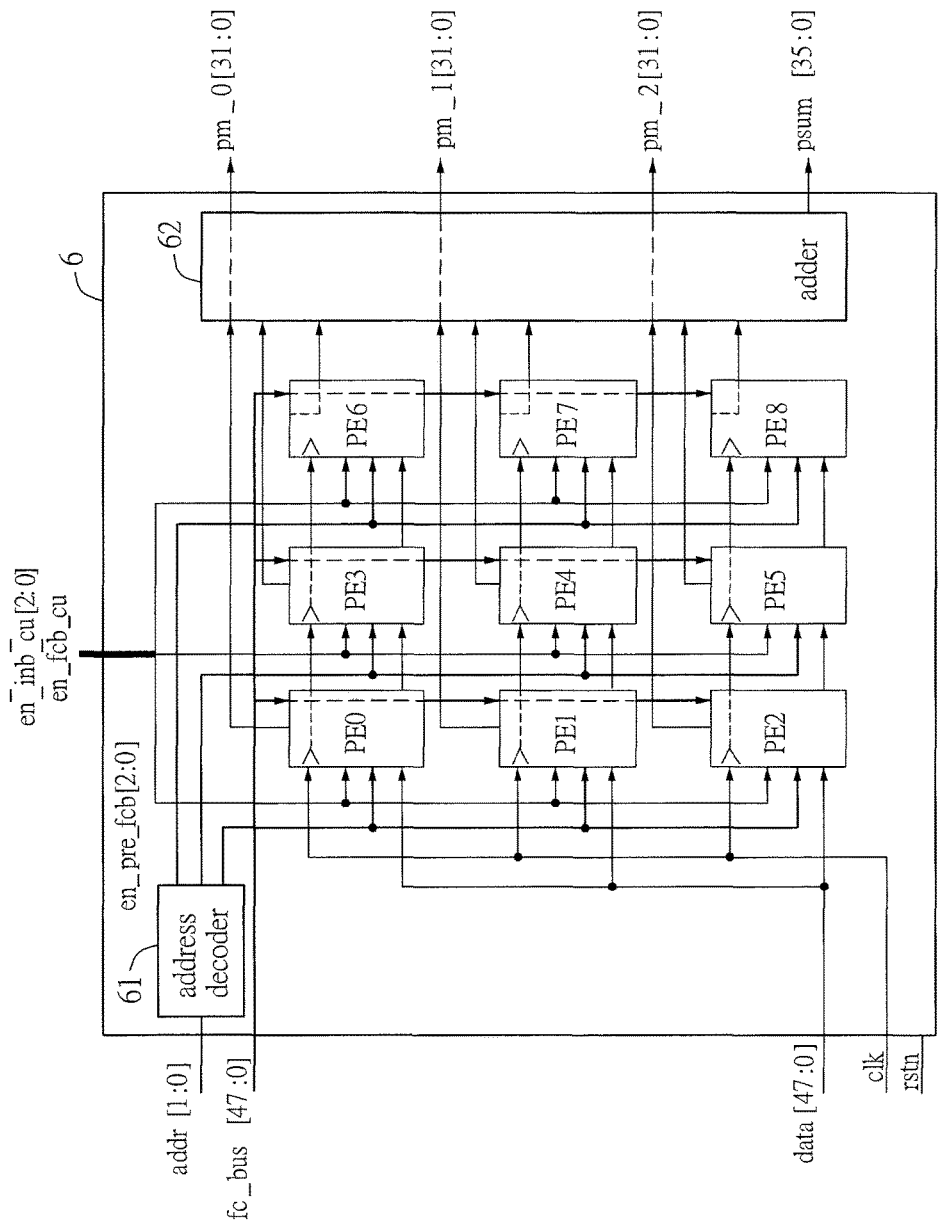
FIG. 5 is a block diagram showing a convolution unit according to an embodiment of the invention.

FIG. 5 is a block diagram showing a convolution unit according to an embodiment of the invention. With reference to FIG. 5, a 3×3 convolution unit is used in the following embodiment. The convolution unit 6 includes 9 process engines PE0~PE8, an address decoder 61, and an adder 62. The inputted data for the convolution operation are inputted the process engines PE0~PE2 through the line data [47:0]. The process engines PE0~PE2 input the inputted data of the current clock to the process engines PE3~PE5 in the next clock. The process engines PE3~PE5 input the inputted data of the current clock to the process engines PE6~PE8 in the next clock. The filter coefficient can be inputted to the process engines PE0~PE8 through the line fc_bus [47:0]. When executing the convolution operation, the process engines PE execute multiplications of the inputted data, which are inputted to the PE0~PE8, and the filter coefficients of the addresses selected by the address decoder 61. When the convolution unit 6 executes a 3×3 convolution operation, the adder 62 obtain a sum of the results of multiplications, which is the output psum [35:0]. When the convolution unit 6 executes a 1×1 convolution operation, the adder 62 outputs the results of the convolution operations of the process engines PE0~PE2 as the outputs pm_0 [31:0], pm_1 [31:0], and pm_2 [31:0].

In addition, a convolution operation method for a data stream includes the following steps of: retrieving inputted data in a previous convolution operation from a buffer; retrieving residual data from the data stream, which are still not inputted in the previous convolution operation; generating a plurality sets of remap data according to the data retrieved from the buffer and the data stream; executing a current convolution operation based on a filter and the sets of the remap data; and keeping a part of data executed in the current convolution operation in the buffer, which is provided for a next convolution operation.

In one embodiment, W data, which are still not inputted in the previous convolution operation, are retrieved from the data stream in the memory, and W sets of the remap data are generated as inputs of W convolution operations. The latest K data of the W data, which are still not inputted in the previous convolution operation, are kept in the buffer for the next convolution operation. Each set of the remap data includes M remap data, and the convolution operation is an M×M convolution operation.

In one embodiment, each stride between the convolution operations is 1, and each set of the remap data includes 3 remap data. The convolution operation is a 3×3 convolution operation, and the latest 2 of the data, which are still not inputted in the previous convolution operation, are kept in the buffer for the next convolution operation.

In one embodiment, the buffer is a register configured inside a processor, and the memory is cache memory configured inside the processor.

The convolution operation method can be applied to the convolution operation device in the previous embodiment, and the modifications and application details will be omitted here. The convolution operation method can also be applied to other computing devices. For example, the convolution operation method for a data stream can be performed in a processor that can execute instructions. The instructions for performing the convolution operation method are stored in the memory. The processor is coupled to the memory for executing the instructions so as to performing the convolution operation method. For example, the processor includes a cache memory, a mathematical operation unit, and an internal register. The cache memory is configured for storing the data stream, and the mathematical operation unit is configured for executing the convolution operation. The internal register can keep a part data of the current convolution operation in the convolution operation module, which are provided for the next convolution operation.

In summary, the input buffer unit of the buffer device can buffer a part of the inputted data and output the buffered data as the inputted data in the next clock. Accordingly, even if the required amount of inputted data for the convolution operation is larger than the amount of one reading action from the memory, the remapping unit can retrieve the lacked data from the input buffer unit so as to provide sufficient remap data for the convolution operation. This configuration can improve the entire performance of the convolution operation. In addition, since the amount of the data outputted from the memory is equal to the amount of the output of the convolution operation, this architecture is also suitable for processing the data streams.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A buffer device coupled to a memory, comprising:
input lines coupled to the memory and configured to be inputted with data from the memory in a current clock;
an input buffer unit coupled to the input lines and configured to buffer a part of the inputted data and output the part of the inputted data in a later clock; and
a remapping unit coupled to the input lines and the input buffer unit, and configured to generate remap data for a convolution operation according to the data on the input lines and an output of the input buffer unit in the current clock.

2. The buffer device of claim 1, wherein W data are inputted from the memory to the input lines in the current clock, and the remapping unit generates W sets of the remap data for W convolution operations.

3. The buffer device of claim 2, wherein the input buffer unit buffers the latest K data from the W data and outputs the latest K data in the later clock, and the output of the input buffer unit is arranged prior to the input lines in order.

4. The buffer device of claim 3, wherein each set of the remap data comprises M remap data, and the convolution operation is an M×M convolution operation.

5. The buffer device of claim 4, wherein the remapping unit retrieves M data from the output of the input buffer unit and the input lines as a set of the remap data, and the data of the output of the input buffer unit and the input lines in sequence are retrieved by M times every J strides.

6. The buffer device of claim 3, wherein each stride between the convolution operations is 1, each set of the remap data comprises 3 remap data, the convolution operation is a 3×3 convolution operation, and the input buffer unit is configured to buffer the latest 2 inputted data and output the latest 2 inputted data in the later clock.

7. The buffer device of claim 1, further comprising:
a control unit coupled to and controlling the remapping unit.

8. The buffer device of claim 1, wherein the data stored in the memory are in a 2D array, the buffer device is configured as a column buffer, and the input buffer unit is configured as a partial row buffer.

9. The buffer device of claim 1, wherein the remapping unit has a first convolution mode and a second convolution mode,
when operating in the first convolution mode, the remapping unit generates the remap data for the convolution operation according to the data on the input lines and the output of the input buffer unit in the current clock; and
when operating in the second convolution mode, the remapping unit outputs the data on the input lines for the convolution operation in the current clock.

10. The buffer device of claim 9, wherein the first convolution mode is a 3×3 convolution operation mode, and the second convolution mode is a 1×1 convolution operation mode.

11. A convolution operation device, comprising:
a memory;
a convolution operation module; and
a buffer device, comprising:
input lines coupled to the memory and configured to be inputted with data from the memory in a current clock,
an input buffer unit coupled to the input lines and configured to buffer a part of the inputted data and output the part of the inputted data in a later clock, and
a remapping unit coupled to the input lines and the input buffer unit, and configured to generate remap data for a convolution operation according to the data on the input lines and an output of the input buffer unit in the current clock, wherein the remap data are inputted to the convolution operation module.

12. A convolution operation method for a data stream, comprising:

retrieving inputted data in a previous convolution operation from a buffer;

retrieving residual data from the data stream, which are still not inputted in the previous convolution operation;

generating a plurality sets of remap data according to the data retrieved from the buffer and the data stream;

executing a current convolution operation based on a filter and the sets of the remap data; and keeping a part of data executed in the current convolution operation in the buffer, which is provided for a next convolution operation.

13. The convolution operation method of claim 12, wherein W data, which are still not inputted in the previous convolution operation, are retrieved from the data stream in the memory, and the step of generating the plurality sets of remap data generates W sets of the remap data for W convolution operations.

14. The convolution operation method of claim 13, wherein the latest K data of the W data, which are still not inputted in the previous convolution operation, are kept in the buffer for the next convolution operation.

15. The convolution operation method of claim 12, wherein each set of the remap data comprises M remap data, and the convolution operation is an M×M convolution operation.

16. The convolution operation method of claim 12, wherein each stride between the convolution operations is 1, each set of the remap data comprises 3 remap data, the convolution operation is a 3×3 convolution operation, and the latest 2 of the data, which are still not inputted in the previous convolution operation, are kept in the buffer for the next convolution operation.

17. The convolution operation method of claim 12, wherein the buffer is a register configured inside a processor, and the memory is cache memory configured inside the processor.

\* \* \* \* \*